United States Patent [19]
Hashimoto et al.

[11] Patent Number: 5,712,735
[45] Date of Patent: Jan. 27, 1998

[54] CATADIOPTRIC REDUCTION PROJECTION OPTICAL SYSTEM

[75] Inventors: Sumio Hashimoto, Setagaya-ku; Yutaka Suenaga; Yutaka Ichihara, both of Yokohama, all of Japan

[73] Assignee: Nikon Corporation, Tokyo, Japan

[21] Appl. No.: 670,660

[22] Filed: Jun. 26, 1996

Related U.S. Application Data

[62] Division of Ser. No. 482,505, Jun. 7, 1995, which is a continuation of Ser. No. 62,725, May 18, 1993, which is a continuation of Ser. No. 948,248, Sep. 21, 1992.

[30] Foreign Application Priority Data

Sep. 28, 1991 [JP] Japan ........................... 3-276592

[51] Int. Cl.⁶ ............................................. G02B 17/00
[52] U.S. Cl. ........................... 359/727; 359/732; 359/736
[58] Field of Search ........................... 359/726, 727, 359/732, 733, 736

[56] References Cited

U.S. PATENT DOCUMENTS

5,241,423  8/1993  Chiu et al. ........................... 359/727

Primary Examiner—David C. Nelms
Assistant Examiner—John P. Cornely
Attorney, Agent, or Firm—Shapiro and Shapiro

[57] ABSTRACT

A catadioptric reduction projection optical system having a first lens unit having negative refractive power and widening a light beam from a reticle, a prism type beam splitter for transmitting therethrough a light beam from the first lens unit, a concave reflecting mirror for returning the light beam emerging from the beam splitter to the beam splitter while converging it, and a second lens unit having positive refractive power and converging the light beam returned to the beam splitter and reflected by the beam splitter, and forming the reduced image of a pattern on the reticle on a wafer.

19 Claims, 4 Drawing Sheets

SPHERICAL ABERRATION

FIG. 3B

ASTIGMATISM

----- MERIDIONAL PLANE
——— SAGITTAL PLANE

FIG. 3C

DISTORTION (%)

FIG. 3D

LATERAL CHROMATIC ABERRATION

CATADIOPTRIC REDUCTION PROJECTION OPTICAL SYSTEM

This is a division of application Ser. No. 08/482,505 filed Jun. 7, 1995, which is a continuation of application Ser. No. 08/062,725 filed May 18, 1993 (abandoned), which is a continuation of application Ser. No. 07/948,248 filed Sep. 21, 1992 (abandoned).

BACKGROUND OF THE INVENTION

1. Field of the Invention

This invention relates to a catadioptric reduction projection optical system for use, for example, in an exposure apparatus for the manufacture of semiconductive elements, and particularly suitable for application to an optical system for reduction-projecting a pattern more enlarged than the pattern of a real element.

2. Related Background Art

Semiconductive integrated circuits have become more and more minute and exposure apparatuses for printing the patterns thereof are required to have higher resolving power. To satisfy this requirement, the wavelength of a light source must be made short and the numerical aperture (N.A.) of an optical system must be made great. However, if the wavelength becomes short, glass materials standing practical use will become limited because of the absorption of light. If the wavelength becomes 300 mm or shorter, what can be practically used will be only synthetic quartz and fluorite (calcium fluoride). Also, fluorite is bad in temperature characteristic and cannot be used in a great quantity. Therefore, it is very difficult to make a projection lens of a refracting system alone. Further, because of the difficulty of aberration correction, it is also difficult to make a projection optical system having a great numerical aperture of a reflecting system alone.

So, there have been proposed various techniques of constructing a projection optical system by combining a reflecting system and a refracting system. An example of such techniques is a ring field optical system as disclosed in U.S. Pat. No. 4,747,678. In this optical system, an off-axis light beam is used so that incident light and reflected light may not interfere with each other, and the design is made such that only an off-axis zonal portion is exposed to light.

As another example, a projection exposure apparatus comprising a projection optical system having a beam splitter disposed therein, and a catadioptric system for collectively projecting the image of a reticle (mask) by an on-axis light beam is disclosed, for example, in U.S. Pat. Nos. 3,698,808 and 4,953,960.

Figure 5:
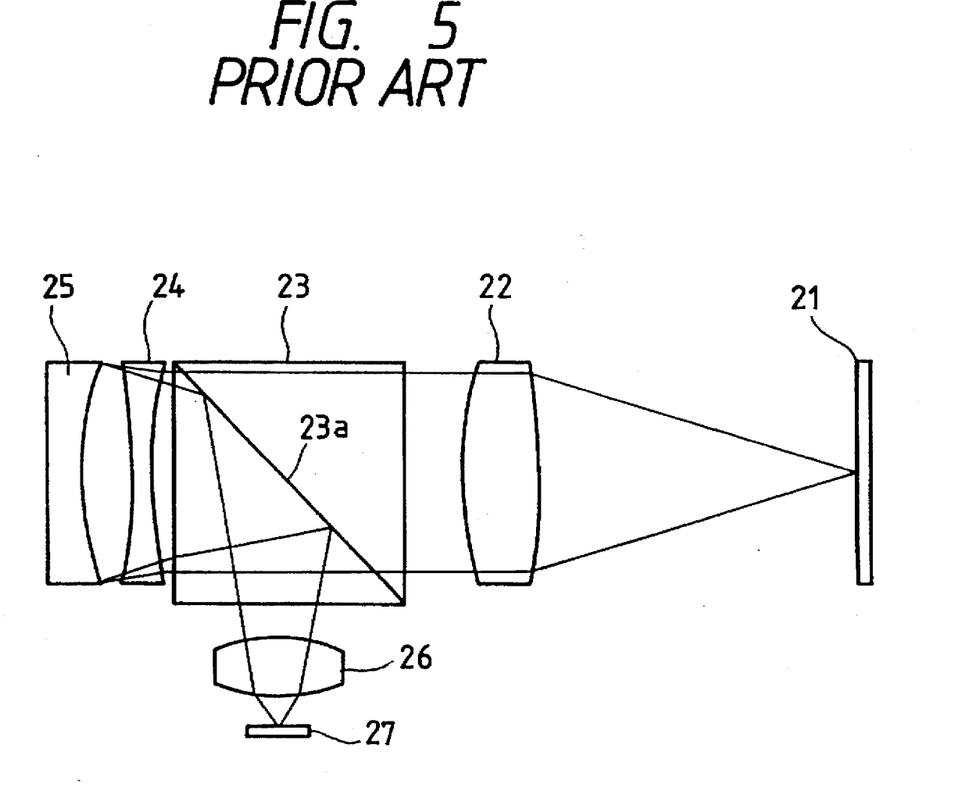
FIG. 5 is a cross-sectional view showing the basic construction of a catadioptric reduction projection optical system according to the prior art.

FIG. 5 of the accompanying drawings schematically shows the optical system disclosed in U.S. Pat. No. 4,953,960. In FIG. 5, a light beam from a reticle 21 on which a pattern to be reduction-transferred is depicted is converted into a substantially parallel light beam by a lens unit 22 having positive refractive power and is applied to a prism type beam splitter (beam splitter cube) 23. The light beam transmitted through the joint surface 23a of this beam splitter 23 is diffused by a correction lens unit 24 having negative refractive power and is reflected by a concave reflecting mirror 25. The light beam reflected by the concave reflecting mirror 25 passes through the correction lens unit 24 again and is reflected by the joint surface 23a of the beam splitter 23, whereafter it is converged on a wafer 27 by a lens unit 26 having positive refractive power, and the reduced image of the reticle pattern is formed on the wafer 27. An example in which a half mirror comprising a plane parallel plate is used instead of the prism type beam splitter 23 is also disclosed.

In the example of the prior art shown in FIG. 5, the reduction magnification of the entire system is ¼ and the magnification in the concave reflecting mirror 25 is 0.287. Also, the magnification of the concave reflecting mirror in the example of the construction using the obliquely disposed plane parallel plate having a half-transmitting surface is 0.136. That is, in the example of the prior art, the design is made such that with the burden of reduction magnification cast on the concave reflecting mirror, aberrations attributable to a concave reflecting mirror of small reduction magnification are corrected by the correction lens unit 24 and the lens unit 26.

In the ring field optical system according to the prior art, however, it is difficult to make the numerical aperture great. Moreover, it is also impossible to expose collectively and therefore, it is necessary to effect exposure while moving the reticle and the wafer at different speeds correspondingly to the reduction ratio of the optical system, and this has led to the inconvenience that the construction of the mechanical system becomes complex.

Also, in the construction disclosed in U.S. Pat. No. 3,698,808, there is the inconvenience that the flare by the reflection on the refracting surface of the optical system subsequent to the beam splitter is great. Further, characteristics such as the reflectance irregularity, absorption and phase change of the beam splitter are not at all taken into account and therefore, the resolving power is low and the magnification of the entire system is one-to-one magnification, and the apparatus of the prior art cannot possibly stand the use as a semiconductor manufacturing exposure apparatus of the coming generation of which higher resolving power is required.

Furthermore, in the projection optical system disclosed in U.S. Pat. No. 4,953,960, almost all of the reduction magnification of the entire system is borne by the concave reflecting mirror, and this leads to the inconvenience that spherical aberration created by the concave reflecting mirror is great. Accordingly, an optical system for correcting that spherical aberration becomes complicated. Also, since the design is made such that the light beam from the reticle 21 is converted into a substantially parallel light beam by the lens unit 22 of positive refractive power, the spacing between the reticle 21 and the beam splitter 23 becomes long, and this leads to the bulkiness of the optical system.

SUMMARY OF THE INVENTION

In view of the above-noted points, the present invention has as an object the provision of a reduction projection optical system of a construction in which a beam splitter is disposed in a catadioptric system and in which spherical aberration attributable to a concave reflecting mirror is small.

Figure 1:
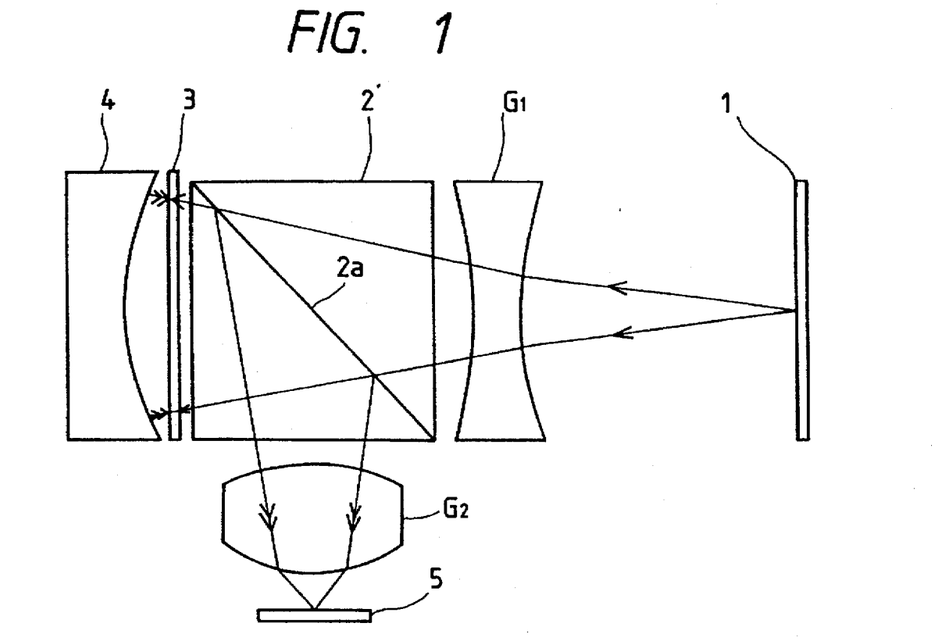
FIG. 1 is a cross-sectional view showing the basic construction of an embodiment of a catadioptric reduction projection optical system according to the present invention.

The catadioptric reduction projection optical system according to the present invention is an optical system for reduction-projecting the pattern of a first surface (1) onto a second surface (5), as shown, for example, in FIG. 1 of the accompanying drawings, and has a first lens unit G1 preferably having reduction magnification and widening a light beam from the first surface, a prism type beam splitter (2) transmitting therethrough or reflecting the light beam from the first lens unit, a concave reflecting mirror (4) returning the light beam emerging from the beam splitter to the beam splitter while converging the light beam, and a second lens unit G2 having positive refractive power and converging the light beam returned to the beam splitter and reflected by or transmitted through the beam splitter, and forming the reduced image of the pattern of the first surface (1) on the second surface (5).

In this case, it is preferable that the radius of curvature of the concave reflecting mirror (4) be set to a range seventeen times to twenty-five times as great as the diameter of the exposure area (image circle) on the second surface (5).

Also, it is preferable that the magnification of the concave reflecting mirror (4) be 0.6 time to 1.1 times.

In addition, it is preferable that the inclination of the off-axis principal ray incident on the concave reflecting mirror (4) with respect to the optical axis be 5 degrees or less.

According to the present invention, the image of the pattern of the first surface reduced by the first lens unit having reduction magnification is located near the conjugate point of the center of curvature of the concave reflecting mirror and therefore, the concave reflecting mirror can be used at substantially one-to-one magnification. This leads to the advantage that spherical aberration attributable to the concave reflecting mirror can be decreased and as a whole, aberrations can be corrected well.

Also, there is the advantage that when the radius of curvature of the concave reflecting mirror is seventeen times to twenty-five times as great as the diameter of the exposure area of the second surface, astigmatism and distortion can be corrected easily and a predetermined reduction magnification can be obtained easily.

Further, when the magnification of the concave reflecting mirror is 0.6 time to 1.1 times, a predetermined reduction magnification is obtained as a whole, and then the spherical aberration by the concave reflecting mirror can be corrected best.

Furthermore, there is the advantage that when the inclination of the off-axis principal ray incident on the concave reflecting mirror with respect to the optical axis is limited to 5° or less, the amount of aberration such as astigmatism can be suppressed within a predetermined range and the irregularity of the reflectance and transmittance in the beam splitter can be suppressed.

DETAILED DESCRIPTION OF THE PREFERRED EMBODIMENTS

According to the present invention, in a construction comprising a combination of a reflecting system and a refracting system, an on-axis light beam is used to expose a wide area collectively. Also, since there is no chromatic aberration in the reflecting system, the concave reflecting mirror (4) is endowed with most of the refractive power of the entire system to suppress the creation of chromatic aberration. Also, for the suppression of spherical aberration in a concave reflecting mirror (4) which is the main purpose of the present invention, the light beam incident on the concave reflecting mirror (4) can become substantially perpendicular to the reflecting surface thereof. This means that the concave reflecting mirror (4) can be used substantially as one-to-one magnification imaging.

The simplest construction for that is a construction in which the first surface (1) is located near the center of curvature of the reflecting surface of the concave reflecting mirror (4) (actually the conjugate point thereof by the beam splitter (2)). However, if the first surface (1) becomes too close to the concave reflecting mirror (4), the maximum value of the inclination of the off-axis principal ray with respect to the optical axis will become great and astigmatism, etc. will become great. Further, if the angle of incidence of the light beam onto the prism type beam splitter (2) becomes great, the loss of the quantity of light will become great and flare and imaging performance will be deteriorated and thus, good imaging will not be accomplished.

So, in the present invention, the light beam from the first surface (1) is widened by the first lens unit G1 preferably having reduction magnification, whereby the reduced image of the pattern on the first surface (1) is disposed near the conjugate point of the center of curvature of the concave reflecting mirror (4). Since the whole of the optical system must be made into a reduction system, the reduction of the image by the first lens unit G1 is useful. Further, the image is reduced also by the second lens unit G2 having positive refractive power which is disposed between the beam splitter (2) and the second surface (5), whereby a desired reduction rate can be obtained as a whole, in spite of the concave reflecting mirror (4) being of substantially one-to-one magnification.

Also, the separation of the incident light and the reflected light from each other is effected by the prism type beam splitter (2). The use of the prism type beam splitter is for preventing the creation of astigmatism and coma caused by the use of an obliquely disposed plane parallel plate having a half-transmitting surface. Further, to make the angular characteristic of the beam splitter (2) good, it is preferable that for example, the number of layers of multilayer film used as translucent film be made as small as possible. More specifically, it is preferable that transmittance >50% >reflectance. Further, where use is made of multilayer film which has a considerably strong polarizing characteristic, a quarter wavelength plate (3) is disposed between the beam splitter (2) and the concave reflecting mirror (4), whereby reflection efficiency and transmission efficiency in the joint surface of the beam splitter (2) can be improved greatly. Accordingly, the effective utilization of the quantity of light and a reduction in flare can be achieved.

A description will now be given of the reason why the radius of curvature of the concave reflecting mirror (4) should preferably be seventeen times to twenty-five times as great as the diameter of the exposure area (image circle) on the second surface (5). In a concave reflecting mirror, a certain degree of reduction magnification can be achieved by the converging function thereof and influence is imparted to Petzval sum, astigmatism and distortion and thus, it becomes possible to maintain the aberration balance with the refracting system comprising the first lens unit G1 and the second lens unit G2 good. That is, if the radius of curvature of the concave reflecting mirror (4) is below seventeen times the diameter of the image circle of the second surface (5), it will be advantageous for the correction of chromatic aberration, but Petzval sum will increase in the positive direction and astigmatism and distortion will also increase.

The reason is that if the radius of curvature of the concave reflecting mirror becomes small and the refractive power thereof becomes great, the reduction magnification of the first lens unit G1 also becomes great in order that the light beam passing through the beam splitter (2) before and after the reflection on the concave reflecting mirror (4) may be made substantially perpendicular to the reflecting surface of the concave reflecting mirror and therefore, it is necessary that the refractive power of the positive refractive power of the second lens unit G2 be made great for the correction of spherical aberration. However, the second lens unit G2 is disposed near the second surface (5) as the image plane and therefore, for the correction of aberrations, refractive power greater than the refractive power of the first lens unit G1 is required of the second lens unit and thus, Petzval sum increases remarkably. Accordingly, to correct aberrations better, it is desirable that the radius of curvature of the concave reflecting mirror (4) be greater than nineteen times the diameter of the image circle of the reduced image.

If conversely, the radius of curvature of the concave reflecting mirror (4) becomes great beyond twenty-five times the diameter of the image circle of the reduced image, it will be advantageous for the correction of astigmatism and distortion, but it will become difficult to obtain a desired reduction magnification and the correction of chromatic aberration will become insufficient, and this is not very practical.

In the present invention, the concave reflecting mirror (4) is used at substantially one-to-one magnification, and it is preferable that the range of the magnification thereof be 0.6 time to 1.1 times. That is, if the magnification is smaller than 0.6 time, spherical aberration will become great and the optical system for correcting it will become complicated. On the other hand, now that the magnification of the entire system is a reduction magnification, it is originally not preferable that the magnification of the concave reflecting mirror (4) exceed 1 time, but the fact that the magnification becomes great means that the radius of curvature becomes great and further that spherical aberration can be made small. So, it is considered that when importance is attached to an improvement in aberrations even at the sacrifice of magnification, up to the order of 1.1 times, can be allowed as the magnification of the concave reflecting mirror (4).

A description will now be given of the reason why it is preferable that the inclination of the off-axis principal ray incident on the concave reflecting mirror (4) with respect to the optical axis be 5 degrees or less. First, unless the inclination of the off-axis principal ray is limited like this, astigmatism, etc. on the concave reflecting mirror (4) will become too great. Further, the inclination of the off-axis principal ray incident on the concave reflecting mirror (4) is equal to the inclination of the off-axis principal ray incident on the beam splitter (2) with respect to the optical axis. If the inclination of the off-axis principal ray with respect to the beam splitter (2) is limited like that, the irregularity of reflectance and transmittance on the joint surface of the beam splitter (2) will become small and the irregularity of the variation in phase will also become small and therefore, the imaging performance will be improved as a whole.

A specific embodiment of the catadioptric reduction projection optical system according to the present invention will hereinafter be described with reference to FIGS. 1 to FIGS. 4A, 4B, 4C and 4D. This embodiment is one in which the present invention is applied to the optical system of an exposure apparatus for the manufacture of semiconductors in which the wavelength use is 948 nm and the reduction magnification is ⅕.

Referring to FIG. 1 which schematically shows the construction of the optical system of the present embodiment, the reference numeral 1 designates a reticle on which a pattern for an integrated circuit is formed. A first lens unit G1 having reduction magnification, a prism type beam splitter 2, a quarter wavelength plate 3 and a concave reflecting mirror 4 are successively disposed along the optical axis perpendicular to the reticle 1, and a second lens unit G2 having positive refractive power and a wafer 5 are successively disposed in a direction in which the reflected light by the concave reflecting mirror 4 is reflected by the joint surface $2a$ of the beam splitter 2.

The reticle 1 is illuminated by an illuminating optical system, not shown, and a light beam emerging from the reticle 1 is caused to diverge by the first lens unit G1 of having reduction magnification and enter the beam splitter 2, and the light beam transmitted through the joint surface $2a$ of this beam splitter 2 is caused to be incident on the concave reflecting mirror 4 through the quarter wavelength plate 3. The radius of curvature of the concave reflecting mirror 4 is about 400 mm. The light beam reflected by the concave reflecting mirror 4 passes through the quarter wavelength plate 3 while converging and again enters the beam splitter 2, and the light beam reflected by the joint surface $2a$ of this beam splitter 2 is condensed on the wafer 5 by the second lens unit G2. Thereby the reduced image of the pattern on the reticle 1 is formed on the wafer 5.

Also, a light beam polarized in parallelism to the plane of the drawing sheet of FIG. 1 (P-polarized light) is used as illuminating light. In this case, most light is transmitted through the joint surface $2a$ due to the polarization characteristic of the beam splitter 2, and this transmitted light is further transmitted through the quarter wavelength plate 3, whereby it becomes circularly polarized light. The beam of this circularly polarized light is reflected by the concave reflecting mirror 4 and becomes circularly polarized light opposite in direction, but when the beam of this circularly polarized light opposite in direction is again transmitted through the quarter wavelength plate 3, it becomes linearly polarized light perpendicular to the plane of the drawing sheet of FIG. 1. Most of the light beam polarized in a direction perpendicular to the plane of the drawing sheet of FIG. 1 by the polarization characteristic of the beam splitter 2 is reflected by the joint surface $2a$ and travels toward the wafer 5. Thereby, the return light to the reticle 1 is decreased and thus, the effective utilization of the light beam and a decrease in flare are achieved.

Further, it is desirable that single-axis crystal (for example, rock crystal) of a small thickness be used as the quarter wavelength plate 3. The reason is that if the light beam transmitted through the quarter wavelength plate deviates from a parallel light beam, astigmatism will occur for abnormal rays. This astigmatism cannot be corrected by a method of cementing two crystals together by rotating the optical axes thereof by 90° relative to each other as is usually done for a wavelength plate. That is, astigmatism will occur for both of normal rays and abnormal rays.

Assuming that the amount of this astigmatism is represented by wave surface aberration W, the wave surface aberration is expressed by the following equation:

$$W=(n_o-n_e)d\theta^2/2,$$

where $(n_o-n_e)$ is the difference between the refractive indices of normal rays and abnormal rays, d is the thickness of the crystal, and $\theta$ is the deviation from the parallel light beam, i.e., the angle of divergence (or convergence) of the light beam.

For example, where the quarter wavelength plate is constructed by rock crystal, $(n_o-n_e)=0.01$ and the divergent (convergent) state of the light beam is $\theta=14°$. When the wavelength used is $\lambda$, to maintain a sufficiently good imaging performance, it is necessary to maintain the wave surface aberration W less than a quarter wavelength, i.e., $\lambda/4$. For that purpose, on the assumption that the wavelength $\lambda$ is 248 nm, from the foregoing equation, d must be $$d < 100 \ \mu m.$$

The quarter wavelength plate 3 is very thin like this and therefore, it may be adhesively secured to and supported by the beam splitter 2.

In the construction of FIG. 1, the design is made such that the light beam transmitted through the beam splitter 2 is directed to the concave reflecting mirror 4 and the light beam reflected from this concave reflecting mirror 4 and further reflected by the beam splitter 2 is converged by the second lens unit G2. However, the concave reflecting mirror 4 may be disposed so as to sandwich the beam splitter 2 between it and the second lens unit G2, and the light beam reflected by the beam splitter 2 may be applied to the concave reflecting mirror 4, and the light beam reflected from this concave reflecting mirror 4 and transmitted through the beam splitter 2 may be converged by the second lens unit G2. Also, if a polarizing beam splitter is used as the beam splitter 2, reflectance and transmittance can be further improved by the combination thereof with the quarter wavelength plate. However, even if the beam splitter 2 is not a polarizing beam splitter but an ordinary beam splitter, it has some degree of polarizing characteristic and therefore, reflectance and transmittance can be improved by the combination thereof with the quarter wavelength plate.

A specific example of the construction of the optical system of FIG. 1 will hereinafter be described.

Figure 2:
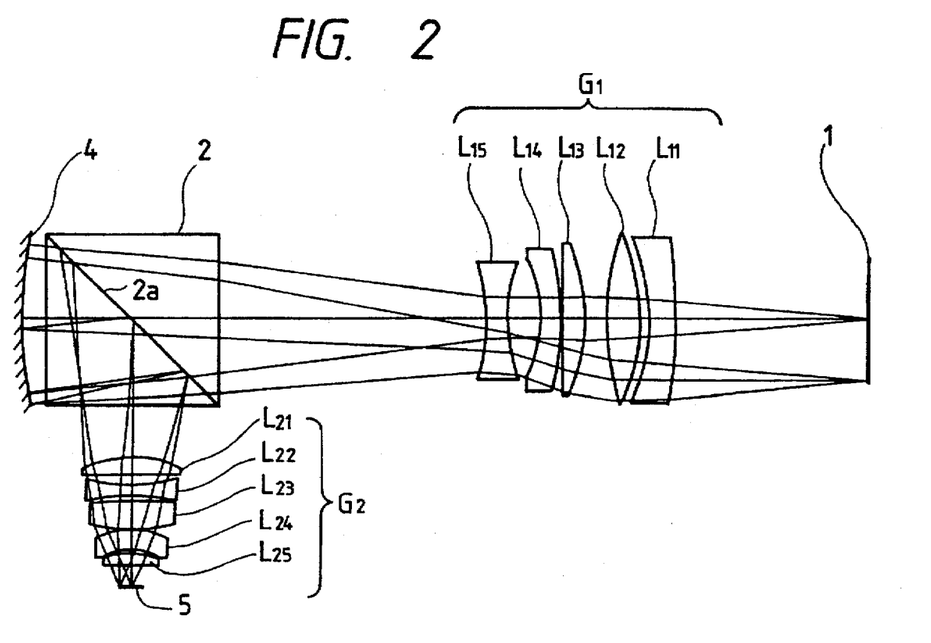
FIG. 2 is a lens construction view showing the specific construction of the optical system of FIG. 1.
Figure 3A:
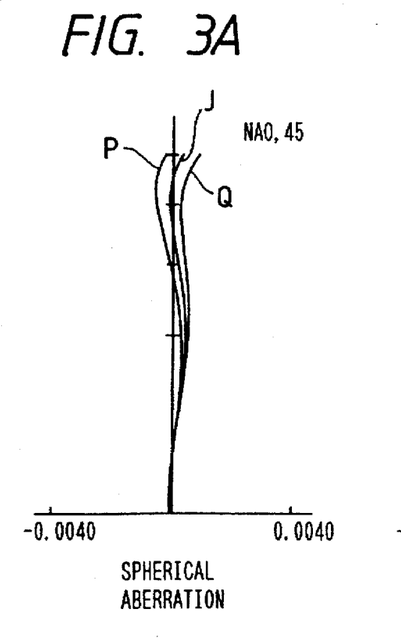
FIGS. 3A, 3B, 3C and 3D show the longitudinal aberrations of the embodiment of FIG. 2.
Figure 3B:
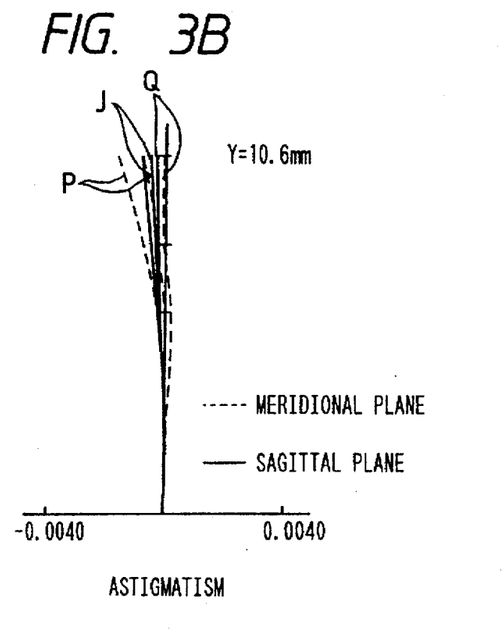
Figure 3C:
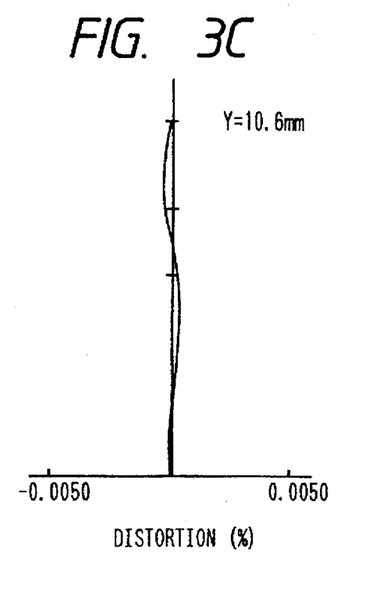
Figure 3D:
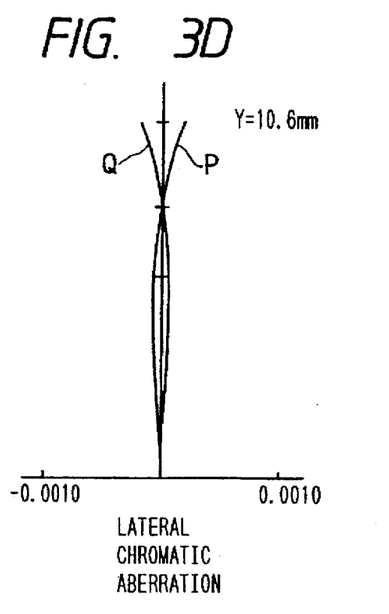
Figure 4A:
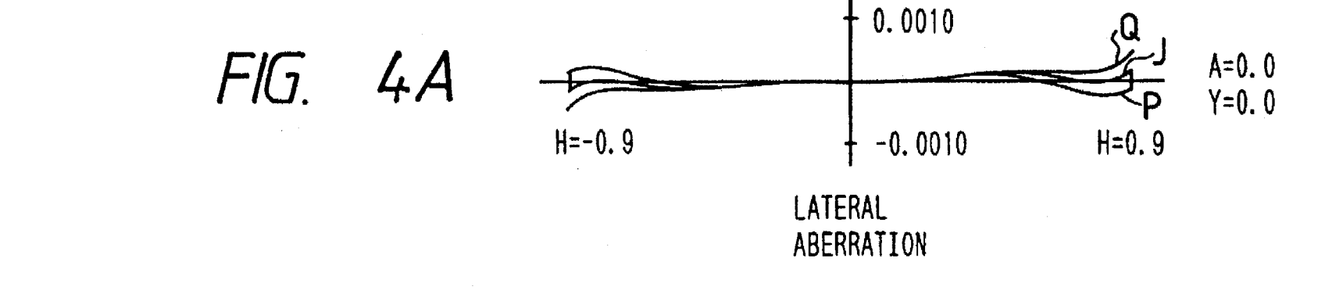
FIGS. 4A, 4B, 4C and 4D show the lateral aberrations of the embodiment of FIG. 2.
Figure 4B:
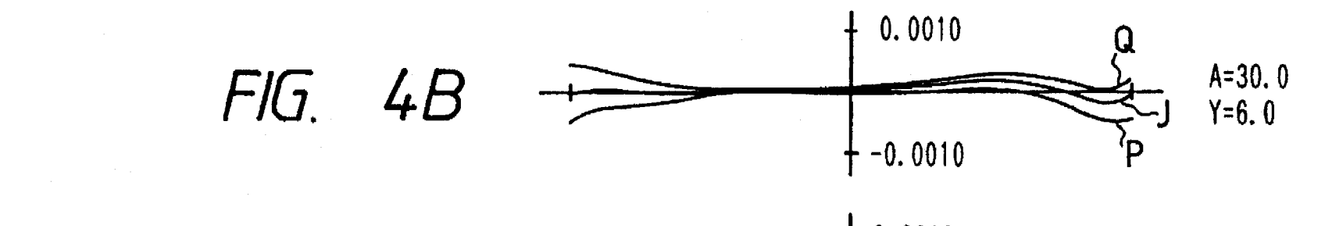
Figure 4C:
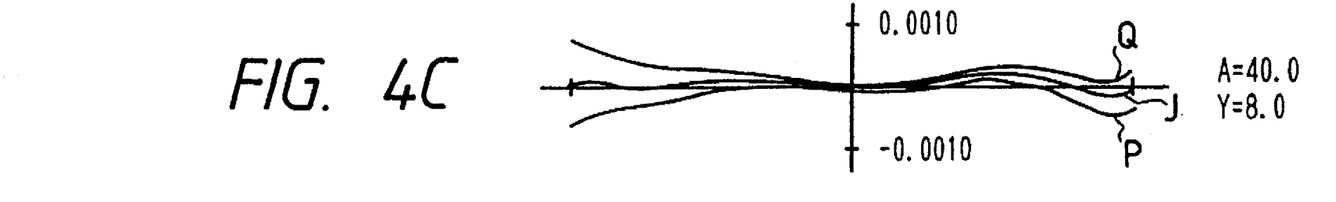
Figure 4D:
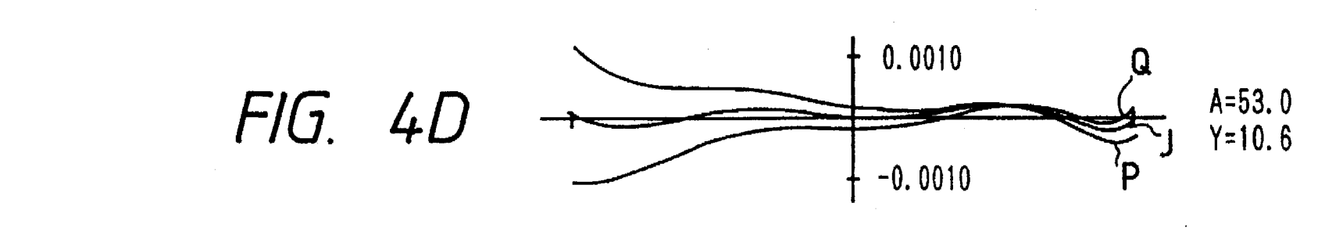

FIG. 2 shows a specific lens construction view of such optical system. As shown in FIG. 2, the first lens unit G1 comprises, in succession from the reticle 1 side, a negative meniscus lens $L_{11}$ having its convex surface facing the reticle 1, a biconvex lens $L_{12}$, a biconvex lens $L_{13}$, a negative meniscus lens $L_{14}$ having its convex surface facing the reticle 1, and a biconcave lens $L_{15}$. The second lens unit G2 comprises, in succession from the prism type beam splitter 2 side, a biconvex lens $L_{21}$, a biconcave lens $L_{22}$, a biconvex lens $L_{23}$, a negative meniscus lens $L_{24}$ having its convex surface facing the beam splitter 2, and a positive meniscus lens $L_{25}$ having its convex surface facing the beam splitter 2. The quarter wavelength plate 3 in FIG. 1 is not shown in FIG. 2 because its thickness is negligibly small.

In order to represent the shapes of and the spacings between the lenses of FIG. 2, with the reticle 1 as the first surface, the surfaces through which the light emerging from the reticle 1 passes until it arrives at the wafer 5 are called the ith surface (i=2, 3, . . . 27). As regards the sign of the radius of curvature $r_i$ of the ith surface, between the reticle 1 and the concave reflecting mirror 4, a case where the ith surface is convex relative to the reticle 1 is chosen to positive, and between the joint surface of the beam splitter and the wafer, a case where the ith surface is convex relative to the joint surface is chosen to positive. Also, the sign of the surface spacing $d_i$ between the ith surface and the (i+1)th surface is chosen to negative in the area wherein the reflected light from the concave reflecting mirror 4 passes to the joint surface of the beam splitter 2, and is chosen to positive in the other areas. The radius of curvature $r_i$, the surface spacing $d_i$ and the glass materials of FIG. 2 will be shown in Table 1 below. In the column of glass materials $CaF_2$ represents fluorite and $SiO_2$ represents quartz glass. The refractive indices of quartz glass and fluorite for the standard wavelength used (248 nm) are as follows:
quartz glass: 1.50855
fluorite: 1.46799

TABLE 1

| i | ri | di | glass material |
|---|---|---|---|
| 1 | ∞ | 161.900 | |
| 2 | 473.382 | 23.000 | $CaF_2$ |
| 3 | 171.144 | 6.000 | |
| 4 | 172.453 | 29.000 | $SiO_2$ |
| 5 | −246.006 | 16.818 | |
| 6 | 148.803 | 20.000 | $SiO_2$ |
| 7 | −2656.033 | 1.000 | |
| 8 | 230.632 | 16.000 | $CaF_2$ |
| 9 | 102.960 | 30.000 | |
| 10 | −143.364 | 18.000 | $SiO_2$ |
| 11 | 147.730 | 223.179 | |
| 12 | ∞ | 145.000 | $SiO_2$ |
| 13 | ∞ | 20.000 | |
| 14 | −394.591 | −20.000 | |
| 15 | ∞ | −72.500 | $SiO_2$ |
| 16 | ∞ | 72.500 | $SiO_2$ |
| 17 | ∞ | 42.626 | |
| 18 | 81.489 | 17.000 | $CaF_2$ |
| 19 | −1339.728 | 7.000 | |
| 20 | −172.194 | 11.000 | $SiO_2$ |
| 21 | 204.909 | 4.300 | |
| 22 | 461.579 | 23.800 | $CaF_2$ |
| 23 | −142.095 | 0.200 | |
| 24 | 55.322 | 18.273 | $SiO_2$ |
| 25 | 40.925 | 3.000 | |
| 26 | 53.590 | 11.000 | $CaF_2$ |
| 27 | 849.726 | 17.541 | |

In the embodiment of FIG. 2, the reduction magnification is ⅕, the numerical aperture is 0.45, and the diameter d of the effective exposure area (image circle) on the wafer 5 is 20 mm. The radius of curvature r of the concave reflecting mirror 4 is 394,591 mm, and the radius of curvature r is about 19.7 times as great as the diameter d. Also, the magnification β in the concave reflecting mirror 4 is about 0.707 and is within said range, and can be regarded as substantially one-to-one magnification.

Further, the maximum value of the inclination of the marginal ray (Rand ray) from the on-axis object point incident on the concave reflecting mirror 4 with respect to the optical axis is 7.72°, and the maximum value of the inclination of the off-axis principal ray incident on the concave reflecting mirror 4 with respect to the optical axis is 3.23°. Incidentally, the maximum value of the inclination of the Rand ray emerging from the concave reflecting mirror 4 with respect to the optical axis is 10.76°.

Longitudinal aberration graphs of the embodiment of FIG. 2 are shown in FIGS. 3A–3D, and lateral aberration graphs of the same embodiment are shown in FIGS. 4A–4D. In these aberration graphs, curves J, P and Q show that the wavelengths used are 248.4 nm, 247.9 nm and 248.9 nm, respectively. From these aberration graphs, it is seen that in the present embodiment, in spite of the numerical aperture being great, aberrations including chromatic aberration are corrected well in the area of a wide image circle of a radius 10.6 mm.

Finally, flare will be described for information. The concave reflecting mirror 4 in the above-described embodiment is used at substantially one-to-one magnification and therefore, light reflected by the concave reflecting mirror 4 tends to return. Accordingly, ghost (i.e., flare) which is the inverted image of the original image is liable to be created on the surfaces of the reticle 1 and the wafer 5. This is reduced by the quarter wavelength plate 3, but the reduction may be insufficient when limitations to flare are severe. However, when limitations to flare are severe, it can be coped with by covering one side of the reticle 1 or one side of the wafer 5 to thereby eliminate ghost. This method is suited for a slit scan type exposure apparatus.

Of course, the present invention is not restricted to the above-described embodiment, but can adopt various constructions without departing from the gist of the invention.

What is claimed is:

1. A catadioptric reduction projection optical system for projecting a reduced image of a pattern of a first surface onto an exposure area of a second surface, including:

a first lens unit;

a prism type beam splitter;

a concave reflecting mirror; and a second lens unit having a positive refractive power;

wherein said catadioptric reduction optical system is so constructed that light from said first surface passes through said first lens unit and subsequently through said prism type beam splitter, and is reflected by said concave reflecting mirror and thereafter passes through said second lens unit;

said catadioptric reduction optical system has a diameter of said exposure area including 20 mm; and said concave reflecting mirror has magnification which is 0.6 times to 1.1 times.

2. The system of claim 1, wherein said first lens unit has reduction magnification.

3. The system of claim 1, wherein a radius of curvature of said concave reflecting mirror is seventeen times to twenty-five times as great as the diameter of the exposure area on said second surface.

4. The system of claim 1, wherein an inclination of an off-axis principal ray incident on said concave reflecting mirror with respect to an optical axis is 5 degrees or less.

5. The system of claim 1, wherein the prism type beam splitter has, a polarizing beam splitter surface, and said system has a quarter wavelength plate disposed between said prism type beam splitter and said concave reflecting mirror.

6. An apparatus for projecting a reduced image of a pattern of a first surface onto an exposure area of a second surface, with a catadioptric optical system disposed on an optical path between said first surface and said second surface, comprising:

a first lens unit;

a prism type beam splitter;

a concave reflecting mirror; and a second lens unit having a positive refractive power;

wherein said catadioptric optical system is so constructed that light from said first surface passes through said first lens unit and subsequently through aid prism type beam splitter, and is reflected by said concave reflecting mirror and thereafter passes through said second lens unit;

said catadioptric optical system has a diameter of said exposure area including 20 mm; and said concave reflecting mirror has magnification which is 0.6 times to 1.1 times.

7. The apparatus of claim 6, wherein said first lens unit has reduction magnification.

8. The apparatus of claim 6, wherein a radius of curvature of said concave reflecting mirror is seventeen times to twenty-five times as great as the diameter of the exposure area on said second surface.

9. The apparatus of claim 6, wherein an inclination of an off-axis principal ray incident on said concave reflecting mirror with respect to an optical axis is 5 degrees or less.

10. The apparatus of claim 6, wherein the prism type beam splitter has a polarizing beam splitter surface, and said system has a quarter wavelength plate disposed between said prism type beam splitter and said concave reflecting mirror.

11. A slit-scan type exposure apparatus for projecting a reduced image of a pattern of a first surface onto an exposure area of a second surface, with a catadioptric optical system disposed on an optical path between said first surface and said second surface, comprising:

a first lens unit;

a prism type beam splitter;

a concave reflecting mirror; and a second lens unit having a positive refractive power;

wherein said catadioptric optical system is so constructed that light from said first surface passes through said first lens unit and subsequently through said prism type beam splitter, and is reflected by said concave reflecting mirror and thereafter passes through said second lens unit;

said catadioptric optical system has a diameter of said exposure area including 20 mm; and said concave reflecting mirror has magnification which is 0.6 times to 1.1 times.

12. The apparatus of claim 1, wherein said first lens unit has reduction magnification.

13. The apparatus of claim 1, wherein a radius of curvature of said concave reflecting mirror is seventeen times to twenty-five times as great as the diameter of the exposure area on said second surface.

14. The apparatus of claim 12, wherein an inclination of an off-axis principal ray incident on said concave reflecting mirror with respect to an optical axis is 5 degrees or less.

15. The apparatus of claim 12, wherein the prism type beam splitter has a polarizing beam splitter surface, and said system has a quarter wavelength plate disposed between said prism type beam splitter and said concave reflecting mirror.

16. A method, for effecting a projection exposure of a reduced image of a first surface onto an exposure area of a second surface, comprising:

passing light, which has passed through said first surface, through a first lens unit;

passing light, which has passed through said first lens unit, through a prism type beam splitter;

reflecting light, which has passed through the prism type beam splitter, with a concave mirror having magnification which is 0.6 times to 1.1 times, to return the reflected light to said beam splitter;

passing light, which has returned to the beam splitter, through the beam splitter; and passing light, which has returned to and passed through the beam splitter, through a second lens unit having a positive refractive power to reach said second surface;

wherein said exposure area on said second surface Bas a diameter including 20 mm.

17. The method of claim 16, wherein said light passed through said first surface is polarized light;

said prism type beam splitter has a polarizing beam splitter surface; and a polarization direction of light propagating from the beam splitter toward said concave mirror and a polarization direction of light propagating from said concave mirror toward said beam splitter are different from each other.

18. The method of claim 17, wherein said light propagating from the beam splitter toward said concave mirror passes through a quarter wavelength plate; and said light propagating from said concave mirror toward said beam splitter passes through said quarter wavelength plate.

19. The method of claim 16, wherein said first lens unit has reduction magnification.

* * * * *

UNITED STATES PATENT AND TRADEMARK OFFICE
CERTIFICATE OF CORRECTION

PATENT NO. : 5,712,735
DATED : January 27, 1998
INVENTOR(S) : Sumio Hashimoto, Yutaka Suenaga, and Yutaka Ichihara It is certified that error appears in the above-identified patent and that said Letters Patent are hereby corrected as shown below:

Claim 12, line 1, "1" should read --11--.
Claim 13, line 1, "1" should read --11--.

Signed and Sealed this

Tenth Day of April, 2001

Attest:

NICHOLAS P. GODICI

*Attesting Officer*  *Acting Director of the United States Patent and Trademark Office*